US006621290B1

(12) United States Patent
Marathe et al.

(10) Patent No.: US 6,621,290 B1
(45) Date of Patent: Sep. 16, 2003

(54) CHARACTERIZATION OF BARRIER LAYERS IN INTEGRATED CIRCUIT INTERCONNECTS

(75) Inventors: Amit P. Marathe, Milpitas, CA (US); Pin-Chin Connie Wang, Menlo Park, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 77 days.

(21) Appl. No.: 09/905,283

(22) Filed: Jul. 13, 2001

(51) Int. Cl.$^7$ .......................... G01R 31/26; H01L 21/66
(52) U.S. Cl. .................... 324/766; 324/158.1; 324/719; 438/17
(58) Field of Search ................................ 324/71.5, 719, 324/158.1, 766–765, 716; 438/17, 18; 257/48

(56) References Cited

U.S. PATENT DOCUMENTS 4,564,808 A * 1/1986 Faughnan et al. .......... 324/766

* cited by examiner

*Primary Examiner*—Kamand Cuneo
*Assistant Examiner*—Paresh Patel
(74) *Attorney, Agent, or Firm*—Mikio Ishimaru

(57) ABSTRACT

A test structure and method for testing a semiconductor material is provided with a semiconductor wafer having an electrical ground and a source of electrical potential. A conductor layer is placed over the semiconductor wafer and a semiconductor material is placed over the conductor layer. A dielectric layer is placed over the semiconductor material. Conductive top and bottom layers are placed over the dielectric layer and the bottom of the semiconductor wafer. The conductive top layer is connected to the electrical ground. The conductive bottom layer is connected to the source of electrical potential. The current flow is measured from the conductive bottom layer to the conductive top layer.

16 Claims, 2 Drawing Sheets

CHARACTERIZATION OF BARRIER LAYERS IN INTEGRATED CIRCUIT INTERCONNECTS

TECHNICAL FIELD

The present invention relates generally to semiconductor technology and more specifically to characterization of barrier layer integrity for integrated circuit interconnects.

BACKGROUND ART

In the manufacture of integrated circuits, after the individual devices such as the transistors have been fabricated in and on a semiconductor substrate or wafer, they must be connected, or "wired", together to perform the desired circuit functions. This interconnection process is generally called "metallization" and is performed using a number of different photolithographic, deposition, and removal processes to create contacts to the transistors, wire/channels to the contacts, and vias interconnecting the channels where there are more than one level of channels.

There are a number of different metalization techniques, but generally, a device dielectric layer is deposited over the transistors, openings are formed through the device dielectric layer down to transistor junctions and gates, and the openings are filled with a conductive metal to form contacts.

In one technique called the "single damascene" or "single inlaid" process, the formation of the first channels starts with the deposition of a thin first channel stop layer on the device dielectric layer. The first channel stop layer is an etch stop layer which is subject to a photolithographic processing step which involves deposition, patterning, exposure, and development of a photoresist, and an anisotropic etching step through the patterned photoresist to provide openings to the contacts. The photoresist is then stripped.

A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched. The first channel dielectric layer is then subject to further photolithographic process and etching steps to form first channel openings in the pattern of the first channels. The photoresist is then stripped.

An optional thin adhesion layer is deposited on the first channel dielectric layer over the entire semiconductor wafer and lines the first channel openings to ensure good adhesion of subsequently deposited material to the first channel dielectric layer. The adhesion layer is a metal such as tungsten (W), titanium (Ti), or tantalum (Ta).

High conductivity metals, such as copper (Cu), diffuse easily through dielectric materials such as silicon oxide and silicon nitride. This diffusion can result in a conductive buildup and cause short circuits in the integrated circuits. To prevent diffusion, a diffusion barrier is deposited on the adhesion layer. For copper conductor materials, the diffusion barrier layer is composed of materials such as tantalum nitride (TaN), titanium nitride (TiN), or tungsten nitride (WN).

However, these nitride compounds have relatively poor adhesion to copper and relatively high electrical resistance so they are problematic. For simplicity, the adhesion and barrier layers are sometimes collectively referred to as a "barrier" layer herein.

For conductor materials, such as copper and copper alloys, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is electroplated on the seed layer and fills the first channel opening. The first conductor material and the seed layer generally become integral, and are often collectively referred to as the conductor core when discussing the main current-carrying portion of the channels.

A chemical-mechanical polishing/planarization (CMP) process is then used to remove the first conductor material, the seed layer, and the barrier layer above- the first channel dielectric layer so the materials and layers are coplanar with the dielectric layer. The CMP process leaves the first conductor "inlaid" in the first channel dielectric layer to form the first channels. When a thing dielectric layer is placed over the first channels as a final layer, it is called a "capping" layer and the single damascene process is completed. When the layer is processed further for placement of additional channels over it, the layer is a via stop layer.

In another technique called the "dual damascene" or "dual inlaid" process, vias and channels are formed at the same time, generally over a completed single damascene process series of first channels. Effectively, two levels of channels of conductor materials in vertically separated planes are separated by an interlayer dielectric (ILD) layer and interconnected by the vias.

The initial step of the dual damascene process starts with the deposition of a thin via stop layer over the first channels and the first channel dielectric layer if it has not already been deposited as a capping layer. The via stop layer is an etch stop layer which is subject to photolithographic processing using a photoresist and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process using a photoresist and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited on the barrier layer and lines the barrier layer in the second channel openings and the vias.

A second conductor material is electroplated on the seed layer and fills the second channel openings and the vias.

A CMP process is then used to remove the second conductor material, the seed layer, and the barrier layer above the second channel dielectric layer to form the second channels. When a layer is placed over the second channels as a final layer, it is called a "capping" layer and the dual damascene process is completed.

The layer may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process for conductor metals such as aluminum. The elimination of metal etch steps is important as the semiconductor industry moves from aluminum (Al) to other metallization materials, such as copper, which ate very difficult to etch.

In the past, it has been necessary to deposit patterned barrier, seed, and conductor core layers to form various test structures to measure leakage and barrier integrity. The formation of the test structures is time consuming and costly.

Solutions to these problems have been long sought but have long eluded those skilled in the art.

DISCLOSURE OF THE INVENTION

The present invention provides a test method and system for testing a semiconductor material on a semiconductor wafer. An electrical ground and a source of electrical potential are provided. A conductor layer is placed over the semiconductor wafer and a semiconductor material is placed over the conductor layer. A dielectric layer is placed over the semiconductor material. Conductive top and bottom layers are placed over the dielectric layer and the bottom of the semiconductor wafer. The conductive top layer is connected to the electrical ground. The conductive bottom layer is connected to the source of electrical potential. The current flow is measured from the conductive bottom layer to the conductive top layer. This results in a simple and inexpensive test method and system.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
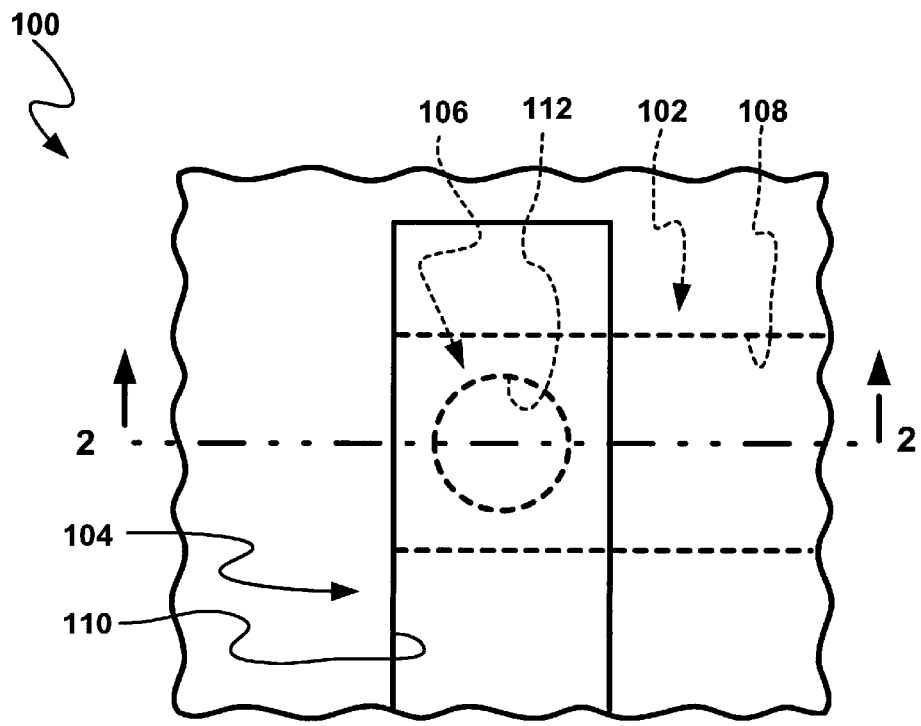
FIG. 1 (PRIOR ART) is a plan view of aligned channels with a connecting via.

Referring now to FIG. 1 (PRIOR ART), therein is shown a plan view of a semiconductor wafer 100 including a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
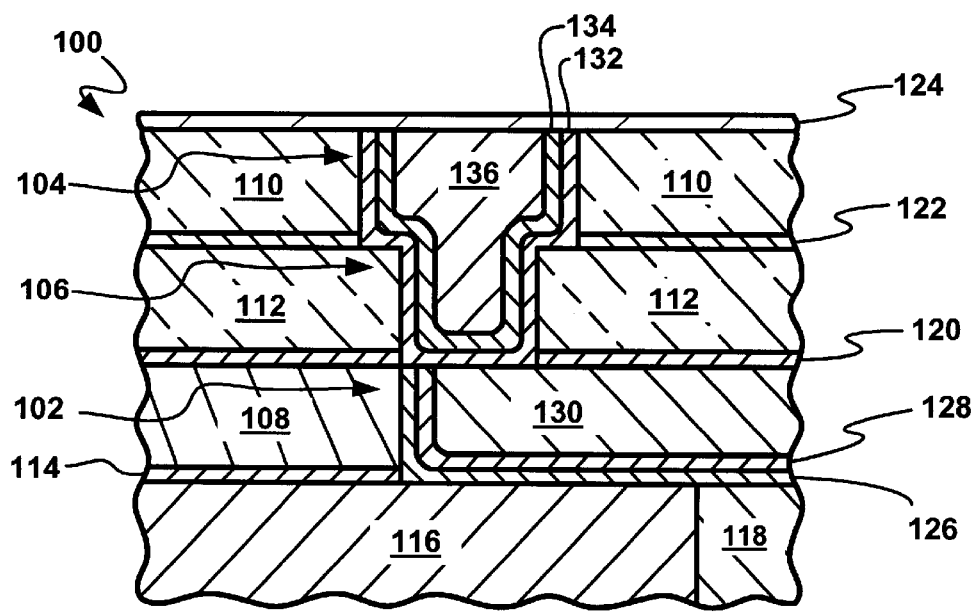
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a capping or via stop layer 124.

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same conductor material as the conductor cores 130 and 136 and become part of the respective conductor cores 130 and 136 after the deposition.

In the past, almost the entire sequence of operations described above were necessary in order to form the test structures required to characterize the barrier layers.

Figure 3:
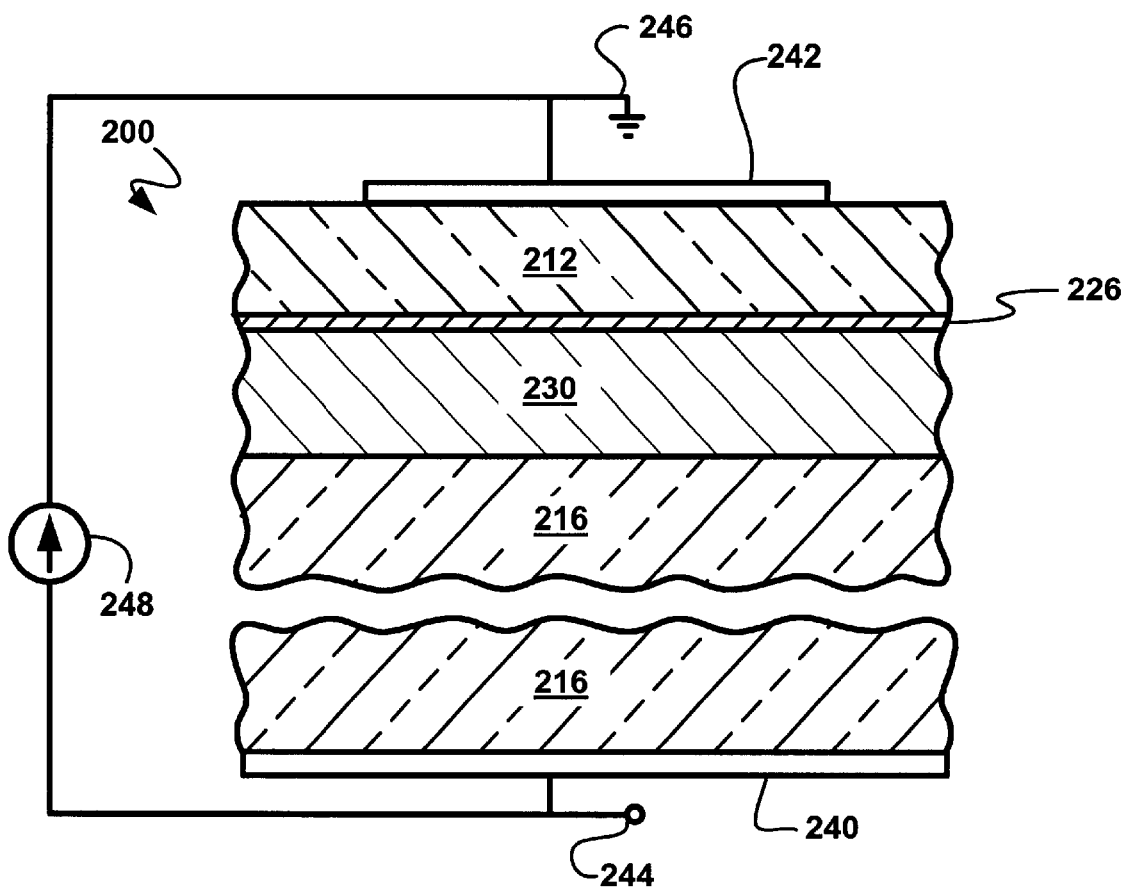
FIG. 3 is a cross-section schematic diagram of a barrier test system according to the present invention.

Referring now to FIG. 3, therein is shown a cross-section schematic diagram of a barrier test system according to the present invention. A semiconductor wafer 200 includes a semiconductor substrate 216. The semiconductor substrate 216 has an unpatterned conductor layer 230 deposited thereon. A barrier layer 226 to be characterized is deposited on the conductor layer 230 followed by the deposition of a dielectric layer 212.

Once the wafer 200 is prepared, conductive layers 240 and 242 are deposited on the top and bottom of the wafer 200. Materials such as aluminum or titanium nitride can be used for the conductive layers 240 and 242.

A voltage is applied across the semiconductor wafer 200 from a positive voltage source 244 connected to the conductive layer 240 to a ground 246 connected to the conductive layer 242. The electrical field causes the conductor ions to diffuse from the conductor layer 230 through the barrier layer 226 into the dielectric layer 212. By placing an ammeter 248 across the positive voltage source 244 to the ground 246 in parallel with the capacitor formed by the conductive layers 240 and 242 and the semiconductor wafer 200, the leakage current can be easily measured and the integrity of the barrier layer 226 can be characterized.

Similarly, the characteristics of the dielectric layer 212 can be determined for a known barrier material.

In various embodiments, the diffusion barrier layers are of materials such as tantalum (Ta), titanium (Ti), tungsten (W), alloys thereof, and compounds thereof. The conductor layer is of a conductor material such as copper, aluminum (Al), gold, silver, alloys thereof, and compounds thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), TMOS (tetramethoxysilane), OMCTS (octamethyleyclotetrasiloxane), HMDS (hexamethyldisiloxane), SOB (trimethylsilil borxle), DADBS (diaceloxyditerliarybutoxsilane), SOP (trimethylsilil phosphate), etc. with dielectric constants below 3.9.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of testing a material used in a semiconductor wafer comprising:

providing a semiconductor substrate;

providing an electrical ground;

providing a source of electrical potential;

placing a conductor layer over the semiconductor substrate;

placing the material used in the semiconductor wafer over the conductor layer;

placing a dielectric layer over the material;

placing a conductive top layer over the dielectric layer;

placing a conductive bottom layer over the bottom of the semiconductor substrate;

connecting the conductive top layer to the electrical ground;

connecting the conductive bottom layer to the source of electrical potential; and measuring current flow from the conductive bottom layer to the conductive top layer.

2. The method as claimed in claim 1 wherein placing the dielectric layer uses a low dielectric constant material.

3. The method as claimed in claim 1 wherein placing the material used in the semiconductor wafer uses a barrier material.

4. The method as claimed in claim 1 wherein:

placing the material used in the semiconductor wafer uses a known barrier layer; and measuring the current flow determines characteristics of the dielectric material.

5. The method as claimed in claim 1 wherein placing the conductor layer deposits a material selected from a group consisting of copper, aluminum, gold, silver, a compound thereof, and a combination thereof.

6. A method of testing a barrier layer comprising:

providing a semiconductor substrate;

providing an electrical ground;

providing a source of electrical potential;

depositing a conductor layer over the semiconductor substrate;

depositing the barrier layer over the conductor layer;

depositing a dielectric layer over the barrier layer;

placing a conductive top layer over the dielectric layer;

placing a conductive bottom layer over the bottom of the semiconductor substrate;

connecting the conductive top layer to the electrical ground;

connecting the conductive bottom layer to the source of electrical potential; and measuring current flow from the conductive bottom layer to the conductive top layer through the semiconductor substrate, the conductor layer, the barrier layer, and the dielectric layer.

7. The method as claimed in claim 6 wherein placing the dielectric layer uses a low dielectric constant material.

8. The method as claimed in claim 6 wherein placing the conductor layer deposits a material selected from a group consisting of copper, aluminum, gold, silver, a compound thereof, and a combination thereof.

9. A test system for a material used in a semiconductor wafer, comprising:

a semiconductor substrate;

an electrical ground;

a source of electrical potential;

a conductor layer over the semiconductor substrate;

the material used in the semiconductor wafer over the conductor layer;

a dielectric layer over the material;

a conductive top layer over the dielectric layer;

a conductive bottom layer over the bottom of the semiconductor substrate;

the conductive top layer connected to the electrical ground;

the conductive bottom layer connected to the source of electrical potential; and a meter for measuring current flow from the conductive bottom layer to the conductive top layer.

10. The system as claimed in claim 9 wherein the dielectric layer is a low dielectric constant material.

11. The system as claimed in claim 9 wherein the material used in the semiconductor wafer is a barrier material.

12. The system as claimed in claim 9 wherein:

the material used in the semiconductor wafer is a known barrier material; and the dielectric material has characteristics to be determined.

13. The system as claimed in claim 9 wherein the conductor layer is a material selected from a group consisting of copper, aluminum, gold, silver, a compound thereof, and a combination thereof.

14. A barrier layer testing system comprising:

a semiconductor substrate;

an electrical ground;

a source of electrical potential;

a conductor layer over the semiconductor substrate;

the barrier layer over the conductor layer;

a dielectric layer over the barrier layer;

a conductive top layer over the dielectric layer;

a conductive bottom layer over the bottom of the semiconductor substrate;

the conductive top layer connected to the electrical ground;

the conductive bottom layer connected to the source of electrical potential; and a meter for measuring current flow from the conductive bottom layer to the conductive top layer through the semiconductor substrate, the conductor layer, the barrier layer, and the dielectric layer.

15. The system as claimed in claim 14 wherein placing the dielectric layer uses a low dielectric constant material.

16. The system as claimed in claim 14 wherein the conductor layer is a material selected from a group consisting of copper, aluminum, gold, silver, a compound thereof, and a combination thereof.

* * * * *